(12) United States Patent
Tsai et al.

(10) Patent No.: US 11,428,711 B2
(45) Date of Patent: *Aug. 30, 2022

(54) TESTING APPARATUS

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS, Santa Clara, CA (US)

( * ) Notice: Subject to any disclaimer, the term of this patent is extended or adjusted under 35 U.S.C. 154(b) by 534 days.

This patent is subject to a terminal disclaimer.

(21) Appl. No.: 16/553,192

(22) Filed: Aug. 28, 2019

(65) Prior Publication Data

US 2020/0355725 A1      Nov. 12, 2020

(30) Foreign Application Priority Data

May 6, 2019   (TW) .................................. 108115566

(51) Int. Cl.
*G01R 1/04*      (2006.01)
*H01R 13/502*    (2006.01)
*H01R 13/24*     (2006.01)
*H05K 1/18*      (2006.01)

(52) U.S. Cl.
CPC ........... *G01R 1/0441* (2013.01); *H01R 13/24* (2013.01); *H01R 13/502* (2013.01); *H05K 1/18* (2013.01); *H01R 2201/20* (2013.01); *H05K 2201/10189* (2013.01)

(58) Field of Classification Search
CPC .... G01R 1/0441; H01R 13/24; H01R 13/502; H01R 2201/20; H05K 1/18; H05K 2201/10189

See application file for complete search history.

(56) References Cited

U.S. PATENT DOCUMENTS

| | | | |
|---|---|---|---|
| 10,726,183 B1* | 7/2020 | Tsai .................... | G01R 31/2863 |
| 2004/0124846 A1* | 7/2004 | Yamashita .......... | G01R 31/2874 |
| | | | 324/537 |
| 2010/0019791 A1* | 1/2010 | Yamashita .......... | G01R 31/2891 |
| | | | 324/757.01 |
| 2011/0254945 A1* | 10/2011 | Kikuchi ............. | G01R 31/2893 |
| | | | 324/750.16 |

(Continued)

*Primary Examiner* — Paresh Patel
(74) *Attorney, Agent, or Firm* — Li & Cai Intellectual Property Office

(57) ABSTRACT

A testing apparatus includes a chip carrying device and a pressing device. The chip carrying device includes a circuit board and a plurality of electrically connecting units that are disposed on the circuit board and each can receive a chip. The pressing device includes a cover and an abutting member disposed between the cover and the electrically connecting units. The cover is disposed on the circuit board to jointly define an accommodating space that accommodates the abutting member and the electrically connecting units. The cover can be connected to an air suction apparatus for expelling air in the accommodating space. When the air suction apparatus performs a suction operation to expel the air in the accommodating space, the abutting member is abutted against the electrically connecting units and the chips so as to connect each of the electrically connecting units and the corresponding chip.

9 Claims, 16 Drawing Sheets

(56) References Cited

U.S. PATENT DOCUMENTS

2014/0367844 A1* 12/2014 Hooper ............... H01L 23/42
                                                            165/185
2015/0276798 A1* 10/2015 Song ................ G01R 31/2601
                                                            324/750.08

* cited by examiner

TESTING APPARATUS

CROSS-REFERENCE TO RELATED PATENT APPLICATION

This application claims the benefit of priority to Taiwan Patent Application No. 108115566, filed on May 6, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a testing apparatus, and more particularly to a testing apparatus provided for testing a chip.

BACKGROUND OF THE DISCLOSURE

In a memory testing process of a conventional memory testing apparatus, memory chips are inserted one-by-one into electrical sockets formed on a circuit board by a human or a robotic arm, and then the conventional memory testing apparatus can be operated to test the memory chips through the electrical sockets and the circuit board. However, in practical use, if a good memory is not firmly connected to the electrical socket (e.g., pins of the good memory chip are not connected to pins of the electrical socket), the good memory chip may be classified as a defective memory chip.

SUMMARY OF THE DISCLOSURE

In response to the above-referenced technical inadequacies, the present disclosure provides a testing apparatus to effectively improve the issues associated with conventional memory testing apparatus (e.g., memory chips are inserted into electrical sockets by a human or a robotic arm, so as to easily result in an unstable connection between the memory chips and the electrical sockets, causing an incorrect testing result).

In one aspect, the present disclosure provides a testing apparatus for testing a plurality of chips. The testing apparatus includes a chip carrying device and a pressing device. The chip carrying device includes at least one circuit board and a plurality of electrically connecting units disposed on the at least one circuit board for carrying the chips. The pressing device includes a cover and an abutting member. The cover has a concavity formed on one side thereof. The cover is disposed on the at least one circuit board so as to jointly define an accommodating space, and the electrically connecting units are arranged in the accommodating space. The cover is configured to be connected to an air suction apparatus for expelling air in the accommodating space so as to cause the accommodating space to be under a negative pressure. The abutting member is disposed between the cover and the electrically connecting units and is at least partially arranged in the accommodating space. When the air suction apparatus performs a suction operation to expel the air in the accommodating space so as to cause the accommodating space to be under a predetermined pressure, the abutting member is abutted against the electrically connecting units and the chips so as to connect each of the electrically connecting units and the corresponding chip.

Therefore, the testing apparatus of the present disclosure can be provided to cooperate with an external air suction apparatus that can perform a suction operation to expel air in the accommodating space to cause the accommodating space to be under a negative pressure, so that the abutting member can tightly press the chips disposed on the electrically connecting units for ensuring each of the chips to be tightly connected to the corresponding electrically connecting unit.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
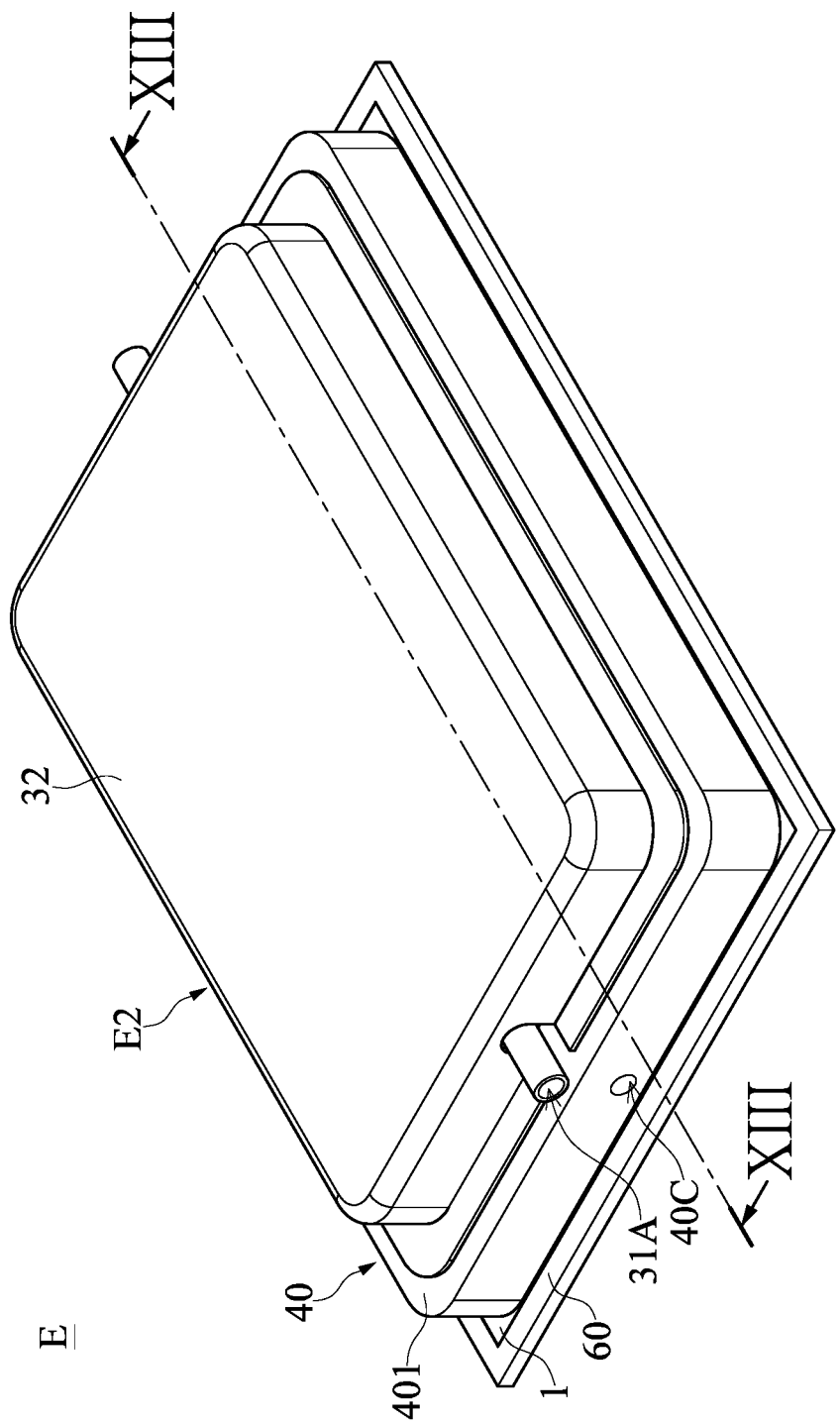
FIG. 1 is a perspective view of a testing apparatus according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
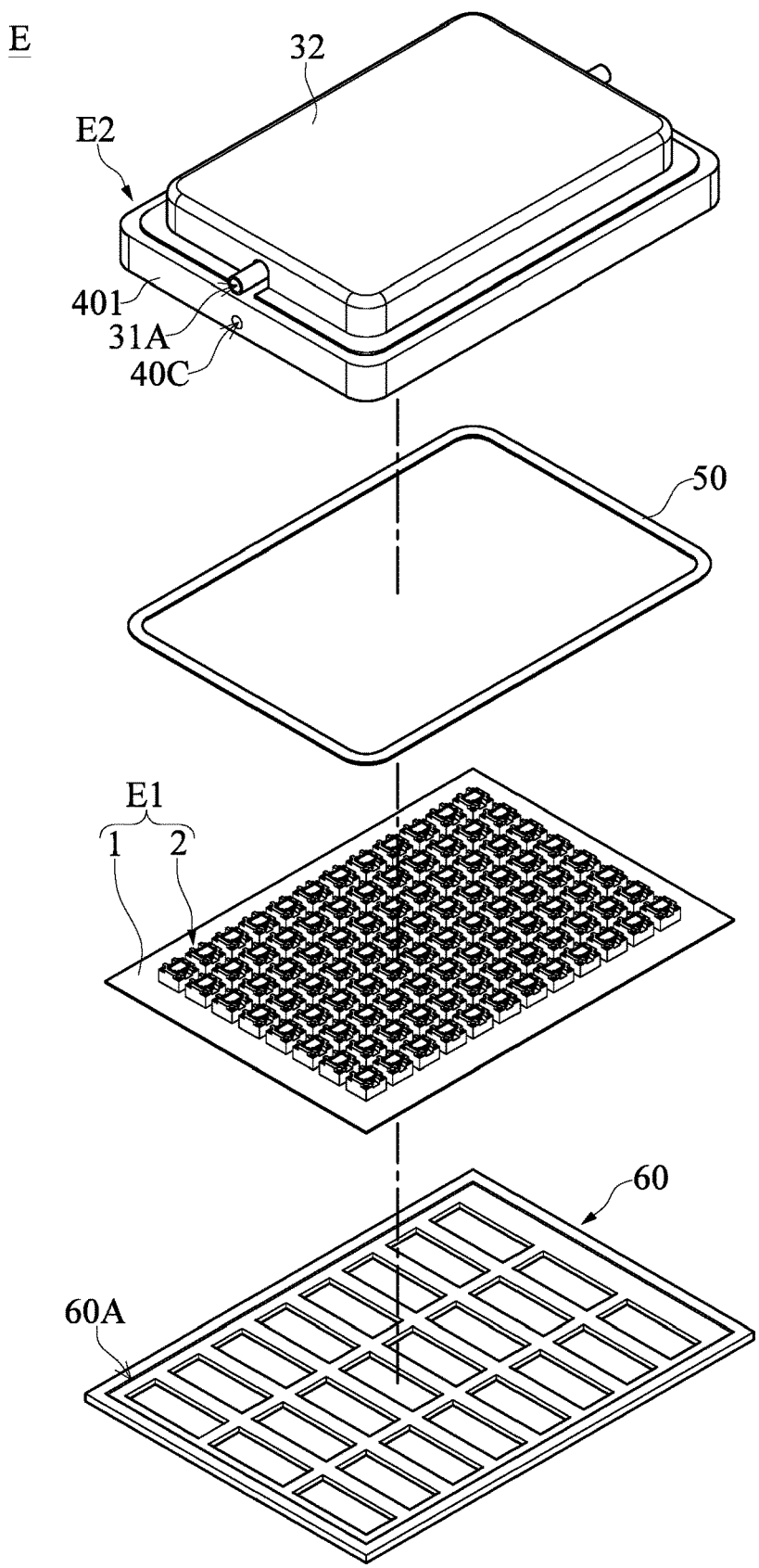
FIG. 2 is an exploded view of the testing apparatus according to the present disclosure.

Referring to FIG. 1 and FIG. 2, a testing apparatus E in an assembled state and in an exploded state according to an embodiment of the present disclosure are shown. The testing apparatus E includes a chip carrying device E1 and a pressing device E2.

The chip carrying device E1 includes a circuit board 1 and a plurality of electrically connecting units 2 mounted on the circuit board 1. In other words, each of the electrically connecting units 2 in the present embodiment can be referred to an electrical socket. Each of the electrically connecting units 2 is configured to carry a chip C (shown in FIG. 7), and includes a plurality of probe assemblies 20 (shown in FIG. 4). One end of each of the probe assemblies 20 is connected to the circuit board 1, and the other end of each of the probe assemblies 20 is connected to the chip C. In other words, the probe assemblies 20 are configured to electrically connect the circuit board 1 and the chip C. In other embodiments of the present disclosure, the number of the circuit board 1 of the chip carrying device E1 can be more than one. The chip C is preferably a NAND flash memory, but is not limited to a memory.

Moreover, the circuit board 1 can be provided with at least one controlling unit (not shown, such as a microprocessor) or a controlling apparatus (not shown, such as a computer), so that the at least one controlling unit or the controlling apparatus can be electrically connected to the chips C through the circuit board 1 for further testing the chips C. The testing process of the at least one controlling unit or the controlling apparatus can be changed or adjusted according to practical requirements or modes of the chips C. The at least one controlling unit or the controlling apparatus can simultaneously test all of the chips C disposed on the circuit board 1 by the same testing process, or can test the chips C respectively disposed on different regions of the circuit board 1 by different testing processes, but the present disclosure is not limited thereto.

Figure 3:
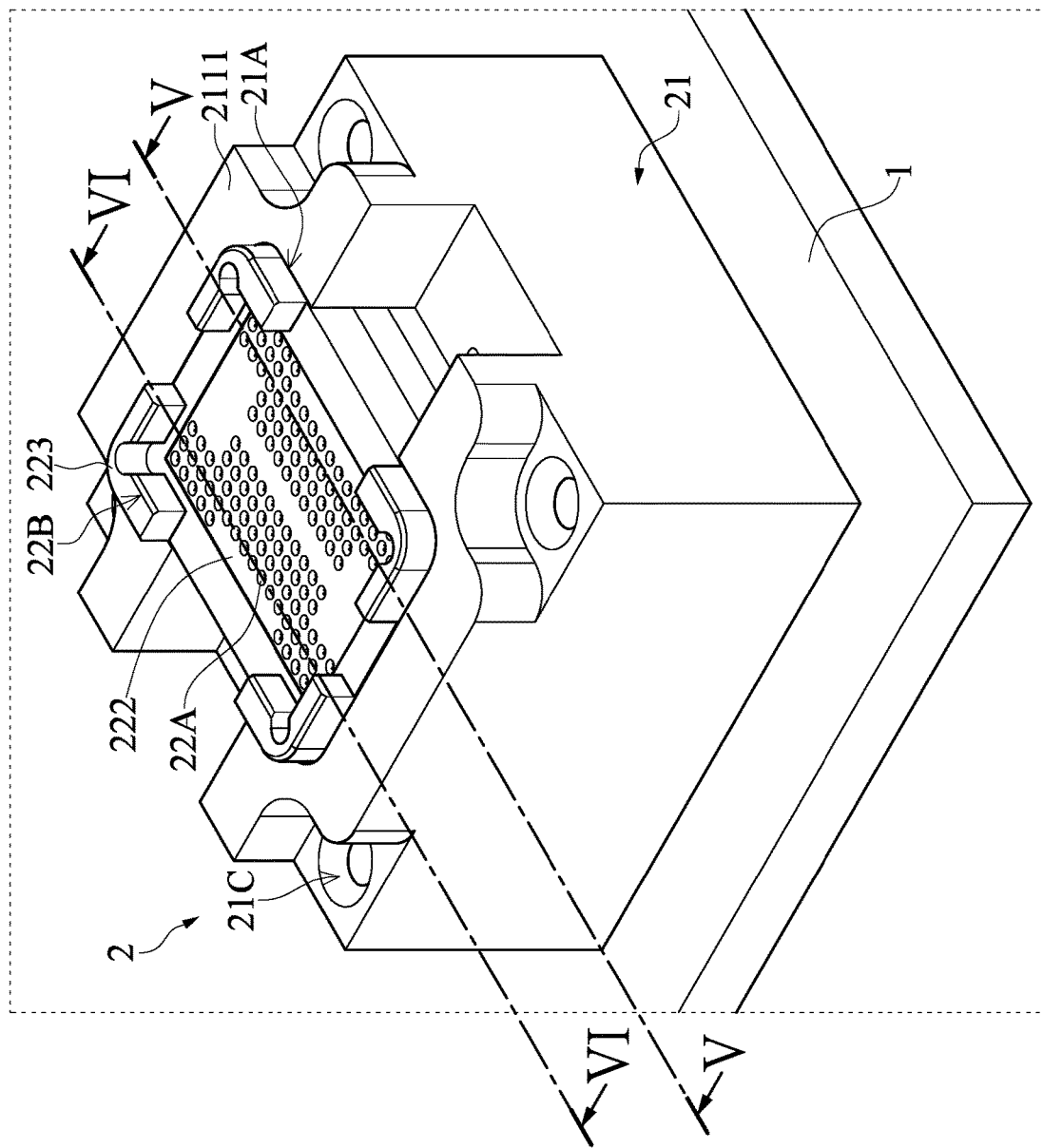
FIG. 3 is an enlarged view showing an electrically connecting unit disposed on a circuit board according to the present disclosure.
Figure 4:
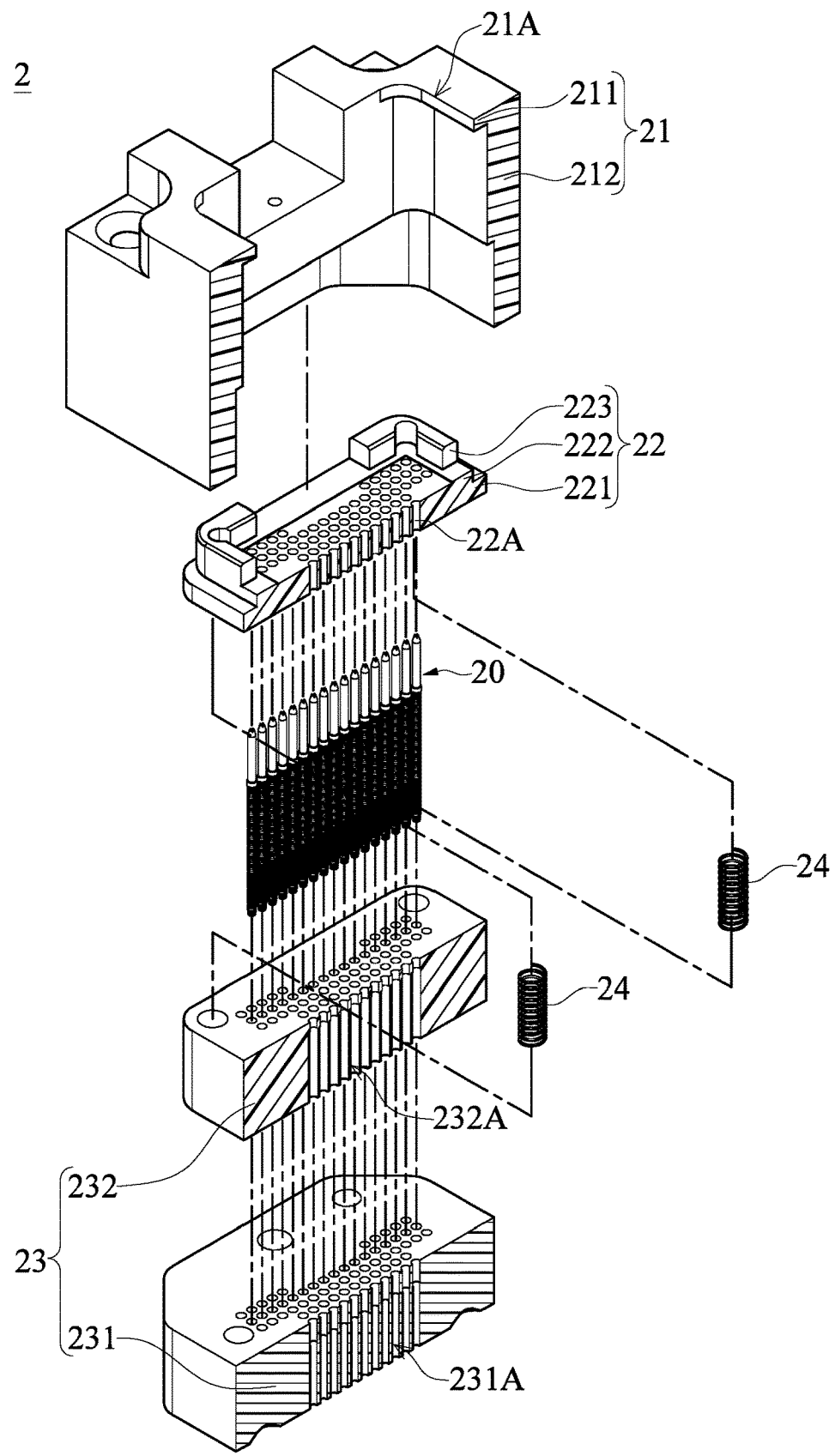
FIG. 4 is a cross-sectional and exploded view of the electrically connecting unit according to the present disclosure.
Figure 5:
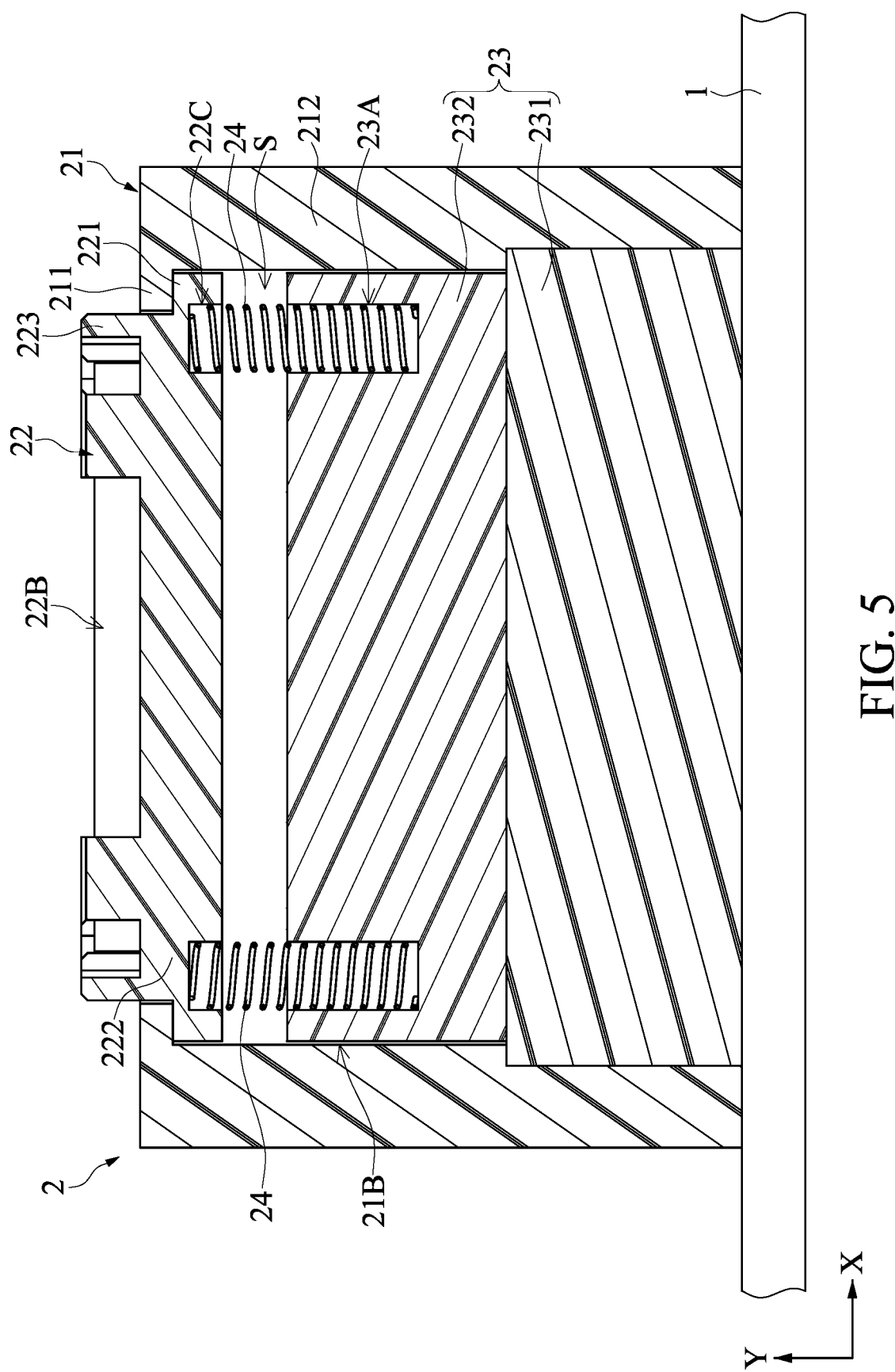
FIG. 5 is a cross-sectional view taken along line V-V of FIG. 3.
Figure 6:
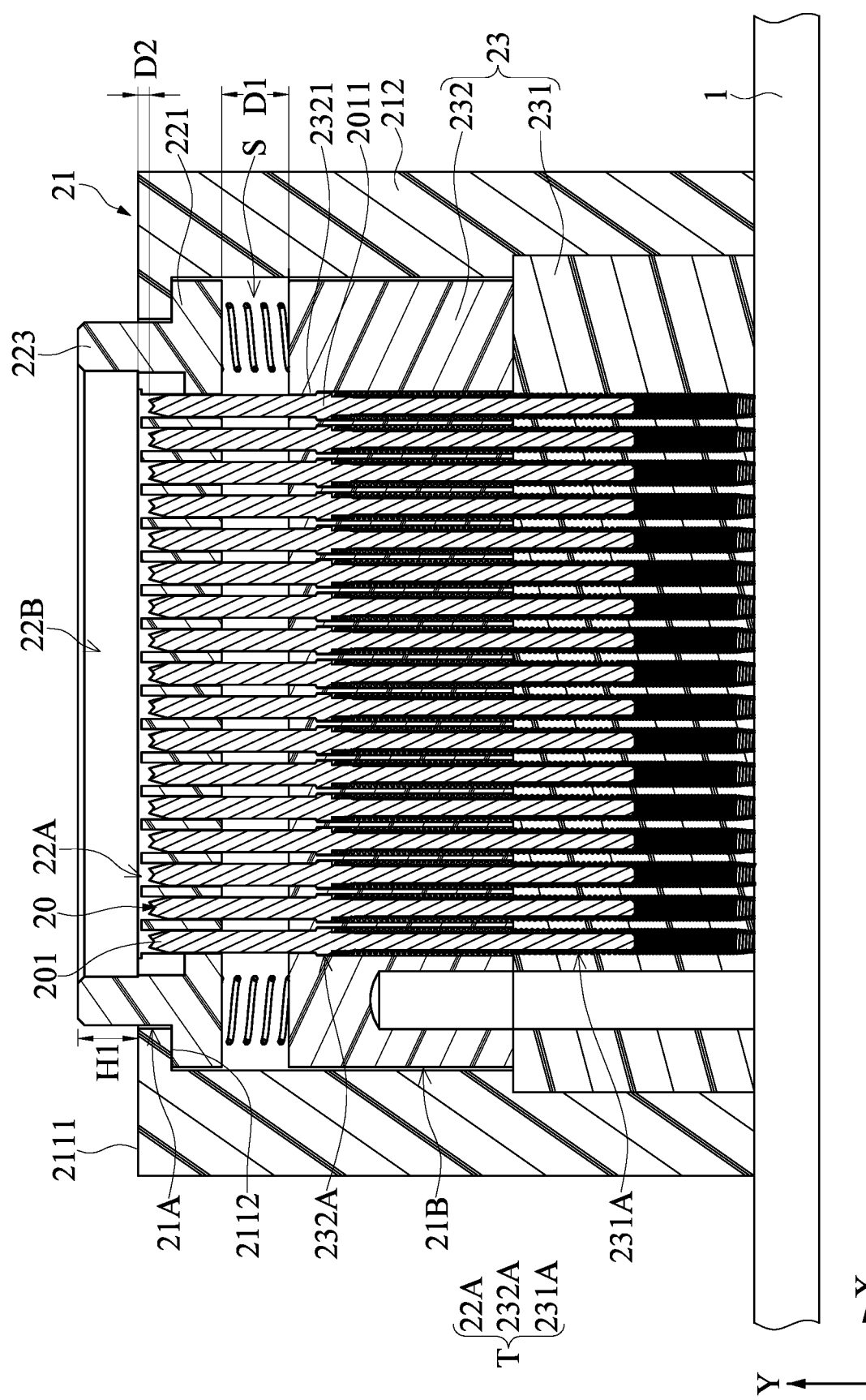
FIG. 6 is a cross-sectional view taken along line VI-VI of FIG. 3.

The pressing device E2 can be manipulated to press a side of each of the electrically connecting units 2 receiving the chip C, so that when the chips C are under a testing process, each of the chips C can be firmly connected to the probe assemblies 20 of the corresponding electrically connecting unit 2. In other embodiments of the present disclosure, the pressing device E2 can be used to change the temperature of each of the chips C, so that the chips C can be tested under a high temperature or a low temperature FIG. 3 is an enlarged view showing one of the electrically connecting units 2 disposed on the circuit board 1 according to the present disclosure. FIG. 4 is a cross-sectional and exploded view of one of the electrically connecting units 2 according to the present disclosure. FIG. 5 is a cross-sectional view taken along line V-V of FIG. 3. FIG. 6 is a cross-sectional view taken along line VI-VI of FIG. 3. As shown in FIG. 3 to FIG. 6, each of the electrically connecting units 2 includes a plurality of probe assemblies 20, a main body 21, a lift structure 22, a supporting structure 23, and four elastic assemblies 24.

The main body 21 has a top wall 211 and an annular wall 212. The top wall 211 has an opening 21A. One end of the annular wall 212 is connected to a peripheral edge of the top wall 211, and the other end of the annular wall 212 is disposed and fixed on the circuit board 1. The top wall 211, the annular wall 212, and the circuit board 1 jointly define an accommodating slot 21B. The top wall 211 has an inner surface 2111 arranged in the accommodating slot 21B and an outer surface 2112 opposite to the inner surface 2111. As shown in FIG. 3, the top wall 211 and the annular wall 212 can be integrally formed as a one-piece structure, and the main body 21 has a plurality of screwing holes 21C for being cooperated with screwing members (e.g., screws) so as to fix the main body 21 onto the circuit board 1, but the present disclosure is not limited thereto.

The lift structure 22 includes a base portion 221 and a carrying portion 222. The base portion 221 is entirely arranged in the accommodating slot 21B. The carrying portion 222 is formed by extending from the base portion 221, and is partially arranged in the opening 21A. The lift structure 22 includes four retaining portions 223 extending from the carrying portion 222 along a direction away from the base portion 221. The four retaining portions 223 can be respectively formed on four corners of the carrying portion 222. The four retaining portions 223 and the carrying portion 222 jointly form a chip receiving slot 22B for accommodating one of the chips C. The four retaining portions 223 are configured to engage with the chip C. Each of the four retaining portions 223 can substantially be an L-shape structure, but the present disclosure is not limited thereto. The number of the retaining portions 223 can be changed according to design requirements, and is not limited to four. Moreover, the position of the retaining portions 223 is not limited to the drawings; that is to say, the four retaining portions 223 can be formed on a part of the carrying portion 222 other than the four corners. The lift structure 22 further has a plurality of connecting holes 22A (shown in FIG. 6) penetratingly formed through the base portion 221 and the carrying portion 222.

Each of the probe assemblies 20 is partially fixed in the supporting structure 23. One end of each of the probe assemblies 20 fixed in the supporting structure 23, which is defined as a first end, is connected to the circuit board 1. The other end of each of the probe assemblies 20 is defined as a second end, and the second ends of the probe assemblies 20 are respectively arranged in the connecting holes 22A. The second ends of the probe assemblies 20 arranged in the connecting holes 22A are configured to respectively connect with a plurality of contacts C2 of the chip C.

As shown in FIG. 4 to FIG. 6, the supporting structure 23 is arranged in the accommodating slot 21B, and the four elastic assemblies 24 are disposed between the supporting structure 23 and the lift structure 22. Each of the four elastic assemblies 24 can be a compression spring. The supporting structure 23 and the lift structure 22 have a plurality of engaging slots 22C, 23A recessed in surfaces thereof facing each other, and the engaging slots 22C respectively correspond in position to the engaging slots 23A. Two end portions of each of the four elastic assemblies 24 are respectively engaged within two of the engaging slots 22C, 23A corresponding in position to each other. In other embodiments of the present disclosure, the supporting structure 23 and the lift structure 22 have a plurality of posts respectively in the engaging slots 22C, 23A, and the two end portions of each of the elastic assemblies 24 are respectively engaged with two of the posts in the two corresponding engaging slots 22C, 23A.

The four elastic assemblies 24 are configured to push the base portion 221 of the lift structure 22 to abut against the inner surface 2112 of the top wall 211, so that the base portion 221 and the supporting structure 23 have a gap S therebetween (shown in FIG. 6). Specifically, when the electrically connecting unit 2 is fixed to the circuit board 1 and the retaining portions 223 are not pressed by an external force, the four elastic assemblies 24 between the lift structure 22 and the supporting structure 23 can be slightly compressed to generate a return force that pushes the lift structure 22 to firmly abut against the inner surface 2112 of the top wall 211.

It should be noted that the number of the elastic assemblies 24 of the elastically connecting unit 2 is not limited to four and can be changed according to design requirements (e.g., can be at least one).

Figure 7:
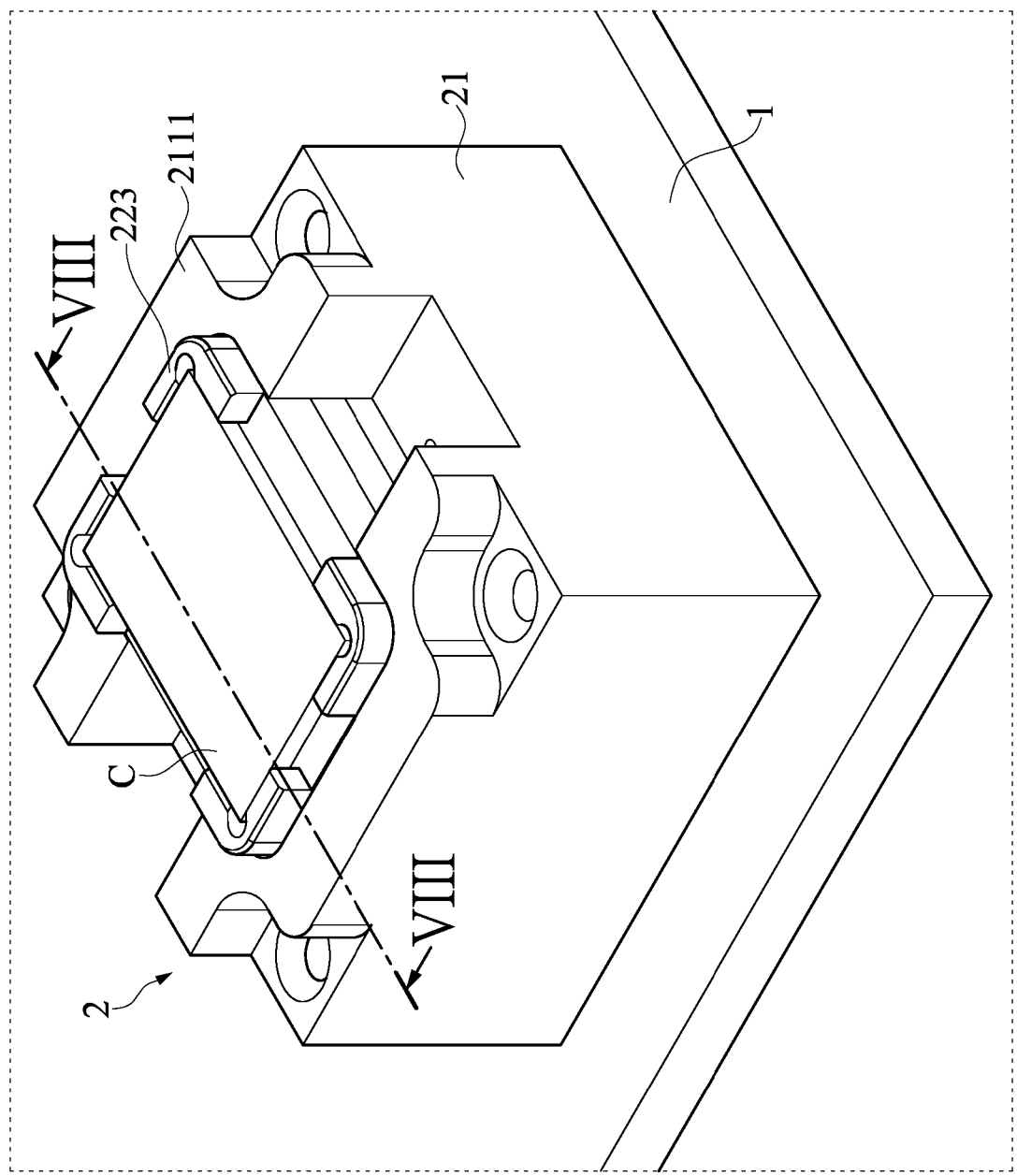
FIG. 7 is an enlarged view showing the electrically connecting unit receiving a chip according to the present disclosure.
Figure 8:
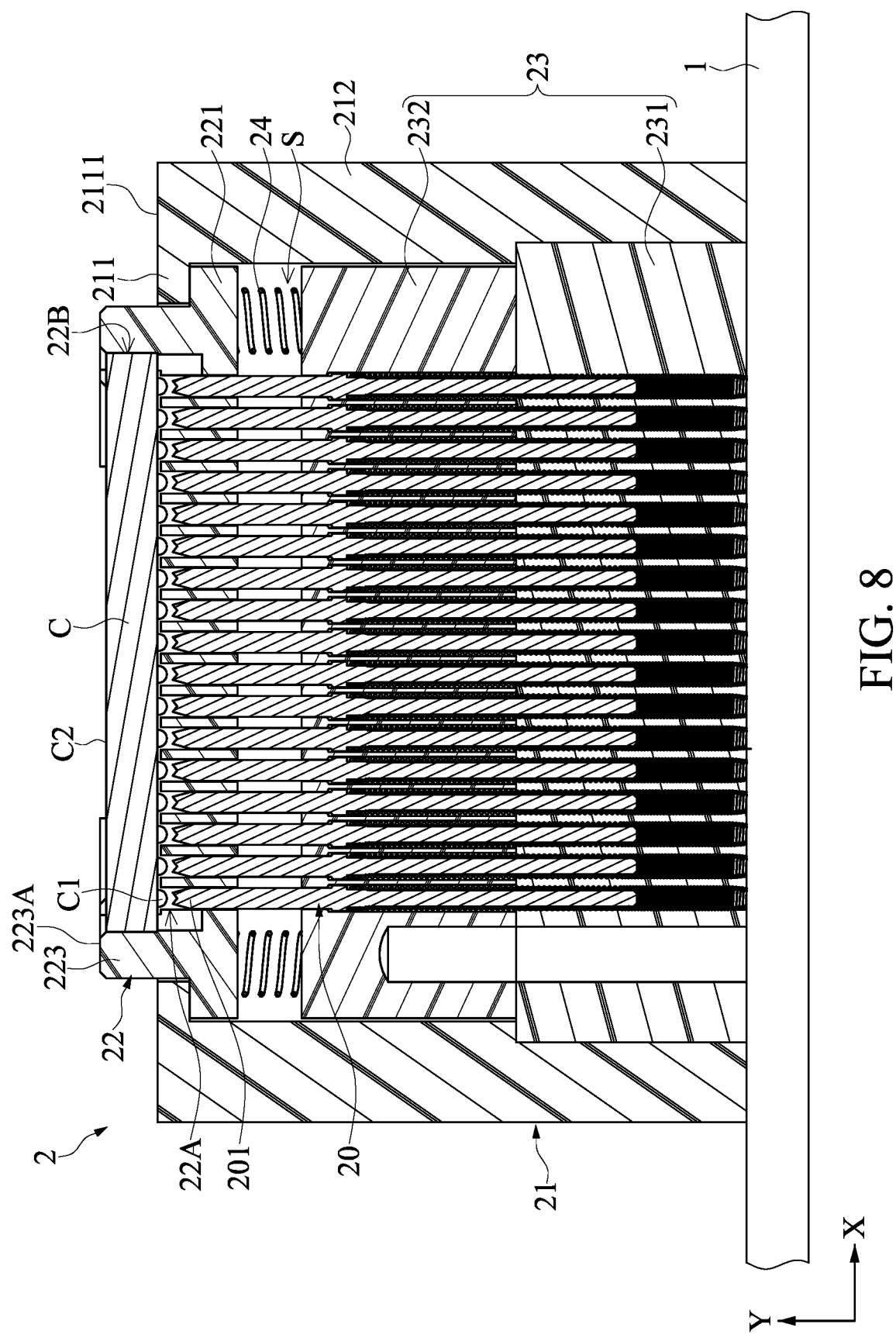
FIG. 8 is a cross-sectional view taken along line VIII-VIII of FIG. 7.

As shown in FIG. 7 and FIG. 8, when the chip receiving slot 22B receives the corresponding chip C and the retaining portions 223 are not pressed by the pressing device E2 (shown in FIG. 2), the contacts C2 of the chip C are respectively arranged in the connecting holes 22A, and the probe assemblies 20 are not connected to (e.g., do not touch) the contacts C2 of the chip C, and the gap S exists between the lift structure 22 and the supporting structure 23. As shown in FIG. 8, an outer surface C2 of the chip C arranged away from the lift structure 22 cannot protrude from the retaining portions 223, but the present disclosure is not limited thereto. In other embodiments of the present disclosure, the outer surface C2 of the chip C can be substantially coplanar with or slightly protrude from an outer surface 223A of each of the retaining portions 223. It should be noted that the contacts C1 shown in the drawings of the present embodiment are solder balls, but the contacts C1 can be changed according to design requirements (e.g., pins or pads).

Figure 9:
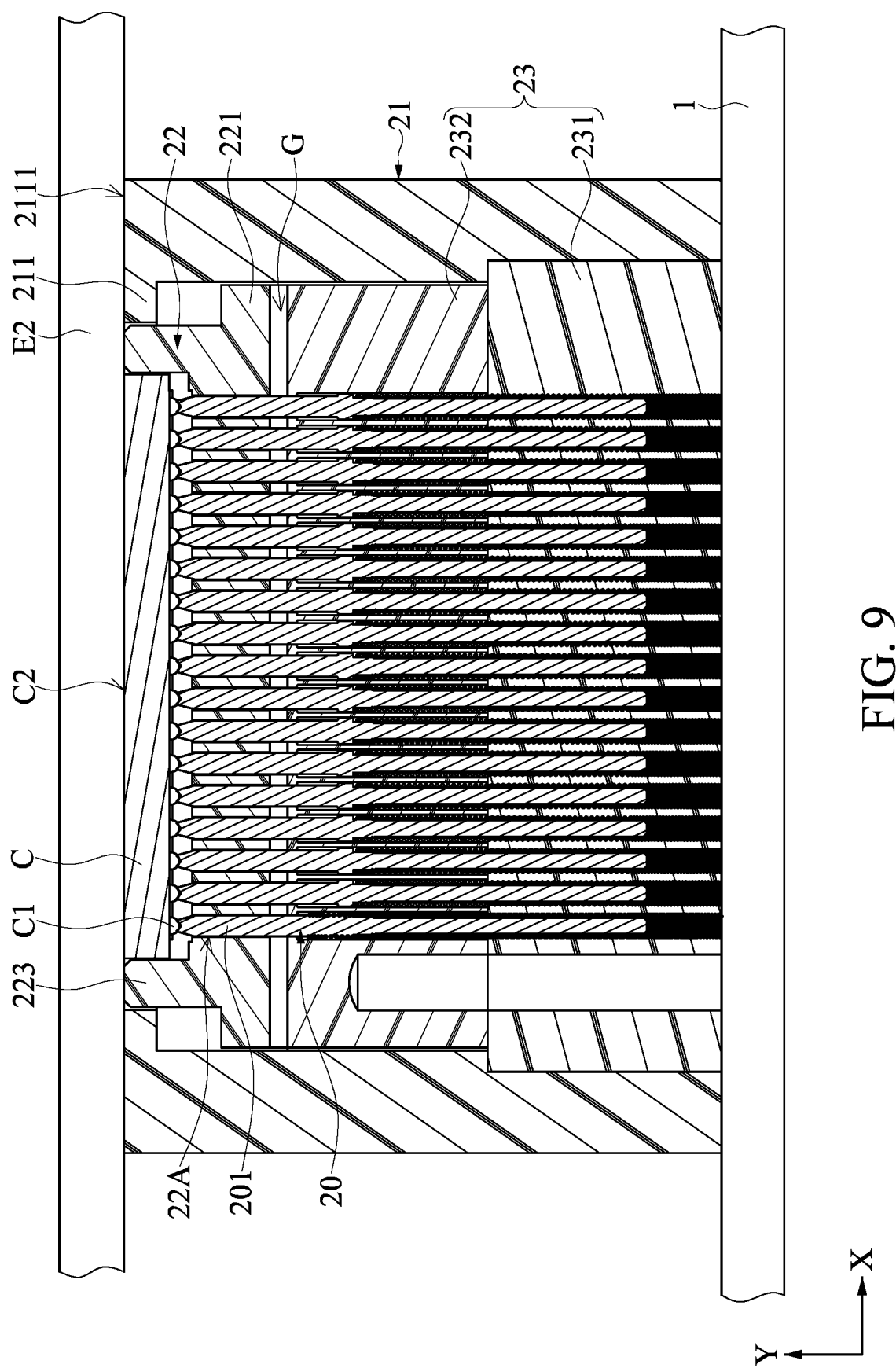
FIG. 9 is a cross-sectional view showing the electrically connecting unit receiving the chip and pressed by a pressing device according to the present disclosure.

As shown in FIG. 9, when the chip receiving slot 22B receives the corresponding chip C and the outer surface 2111 of the top wall 211 is pressed by the pressing device E2, the retaining portions 223 are pressed by the pressing device E2 so as to move toward the accommodating slot 21B (or an inner side of the main body 21). That is to say, the lift structure 22 is moved toward the circuit board 1 relative to the probe assemblies 20.

When the retaining portions 223 are pressed by the pressing device E2 so as to move toward the accommodating slot 21B, the lift structure 22 is moved relative to the probe assemblies 20. When the lift structure 22 is abutted against the supporting structure 23, the second ends of the probe assemblies 20 protrude from the connecting holes 22A and are abutted against the contacts C1 of the chip C for establishing an electrical connection between the probe assemblies 20 and the chip C. It should be noted that if the lift structure 22 is abutted against the supporting structure 23 and the probe assemblies 20 are connected to the chip C, the probe assemblies 20 cannot protrude from the connecting holes 22A. In the drawings of the present embodiment, after the lift structure 22 is pressed, the retaining portions 223 can be entirely received in the accommodating slot 21B (or the main body 21), but the present disclosure is not limited thereto. In other embodiments of the present disclosure, after the lift structure 22 is pressed, each of the retaining portions 223 can be partially received in the accommodating slot 21B (or the main body 21).

When the pressing device E2 is abutted against the outer surface 2111 of the electrically connecting unit 2, the probe assemblies 20 can push the chip C to cause the outer surface C2 of the chip C to abut against an inner side of the pressing device E2. Moreover, when the outer surface C2 of the chip C is abutted against the inner side of the pressing device E2, a spring 202 of each of the probe assemblies 20 is compressed to generate a return force that causes the chip C to firmly abut against the inner surface 2112 of the pressing device E2.

As shown in FIG. 6, a longitudinal direction of each of the probe assemblies 20 can define an axis direction (i.e., a Y axis shown in FIG. 6). When the lift structure 22 is not pressed (and the base portion 221 can be abutted against the top wall 2111), a distance D2 between the second end of each of the probe assemblies 20 and an adjacent edge of the corresponding connecting hole 22A is less than or equal to a distance D1 between the lift structure 22 and the supporting structure 23 in the axis direction. Accordingly, when the lift structure 22 is pressed to abut against the supporting structure 23 (shown in FIG. 9), the second ends of the probe assemblies 20 can be ensured to protrude from the connecting holes 22A so as to be connected to the contacts C1 of the chip C.

It should be noted that as long as the connection between the probe assemblies 20 and the contacts C1 of the chip C can be established after the lift structure 22 is pressed, the distance D1 and the distance D2 can be adjusted according to design requirements. In other words, when the lift structure 22 is pressed, if the connection between the probe assemblies 20 and the contacts C1 of the chip C can be established, each of the probe assemblies 20 can protrude from or can be received in the corresponding connecting hole 22A.

As shown in FIG. 6, when the retaining portions 223 are not pressed, a portion of each of the retaining portions 223 protruding from the opening 21A (or the main body 21) has a length H1 in the axis direction (i.e., the Y axis shown in FIG. 6), and the length H1 is less than or equal to a distance D1 between the lift structure 22 and the supporting structure 23 in the axis direction. Accordingly, each of the retaining portions 223 can be pressed by the pressing device E2 so as to move into the accommodating slot 21B (or the main body 21). If the length H1 is equal to the distance D1, when the pressing device E2 is abutted against the outer surface 2111 of the main body 21, the lift structure 22 will be abutted against the supporting structure 23.

Moreover, when the pressing device E2 is abutted against the outer surface 2111 of the electrically connecting unit 2, the probe assemblies 20 are abutted against the chip C to cause the chip C to abut against the pressing device E2, and the pressing device E2 can be controlled to increase or decrease temperature thereof so as to test the chips C at a high temperature or a low temperature.

The pressing device E2 can be simultaneously attached onto the outer surfaces C2 of the chips C by abutting against the outer surfaces 2111 of the electrically connecting units 2, so that when the pressing device E2 is controlled to increase or decrease the temperature thereof, temperatures of the chips C are changed by the pressing device E2 so as to be almost the same. Accordingly, the chips C can be ensured to be tested under the same temperature.

In prior art, the chips C may be tested in a high temperature environment by the following manner. A circuit board and the chips C inserted to the circuit board are disposed in an oven, and a hot air blower in the oven is used to increase an inner temperature of the oven, so that the chips C can be tested in a high temperature environment. However, the above testing manner of the prior art cannot accurately control the temperature of each region of the oven, so that the chips C cannot be tested in a predetermined temperature environment, causing the testing result to be incorrect. The testing apparatus E of the present disclosure can effectively improve the issues associated with the above testing manner of the prior art.

As shown in FIG. 4, FIG. 6, FIG. 8 and FIG. 9, the supporting structure 23 can include a seat structure 231 and an auxiliary structure 232. The seat structure 231 is arranged in the accommodating slot 21B, and is fixed with the main body 21 (e.g., the seat structure 231 and the main body 21 are fixed to each other by screws). The seat structure 231 has a plurality of thru-holes 231A, and the first ends of the probe assemblies 20 are fixed in the thru-holes 231A.

In addition, since one of the main functions of the seat structure 231 is maintaining the probe assemblies 20 to be firmly and uprightly arranged in the accommodating slot 21B, a diameter of each of the thru-holes 231A of the seat structure 231 can be slightly greater than a maximum diameter of each of the probe assemblies 20, and each of the probe assemblies 20 is movably arranged in the corresponding thru-hole 231A. In the seat structure 231, the number of the thru-holes 231A, a depth of each of the thru-holes 231A, a distance between any two adjacent thru-holes 231A, and the arrangement of the thru-holes 231A can be adjusted or changed according to design requirements, and are not limited to the present embodiment.

The auxiliary structure 232 is arranged in the accommodating slot 21B and between the seat structure 231 and the top wall 211, and the auxiliary structure 232 and the seat structure 231 are fixed to each other (e.g., by screws). The auxiliary structure 232 has a plurality of supporting holes 232A spaced apart from each other. The supporting holes 232A of the auxiliary structure 232 are respectively in spatial communication with the thru-holes 231A of the seat structure 231, and respectively correspond in position to the connecting holes 22A. The connecting holes 22A, the supporting holes 232A, and the thru-holes 231A jointly define a plurality of probe channels T, and the probe assemblies 20 are respectively arranged in the probe channels T.

Figure 10:
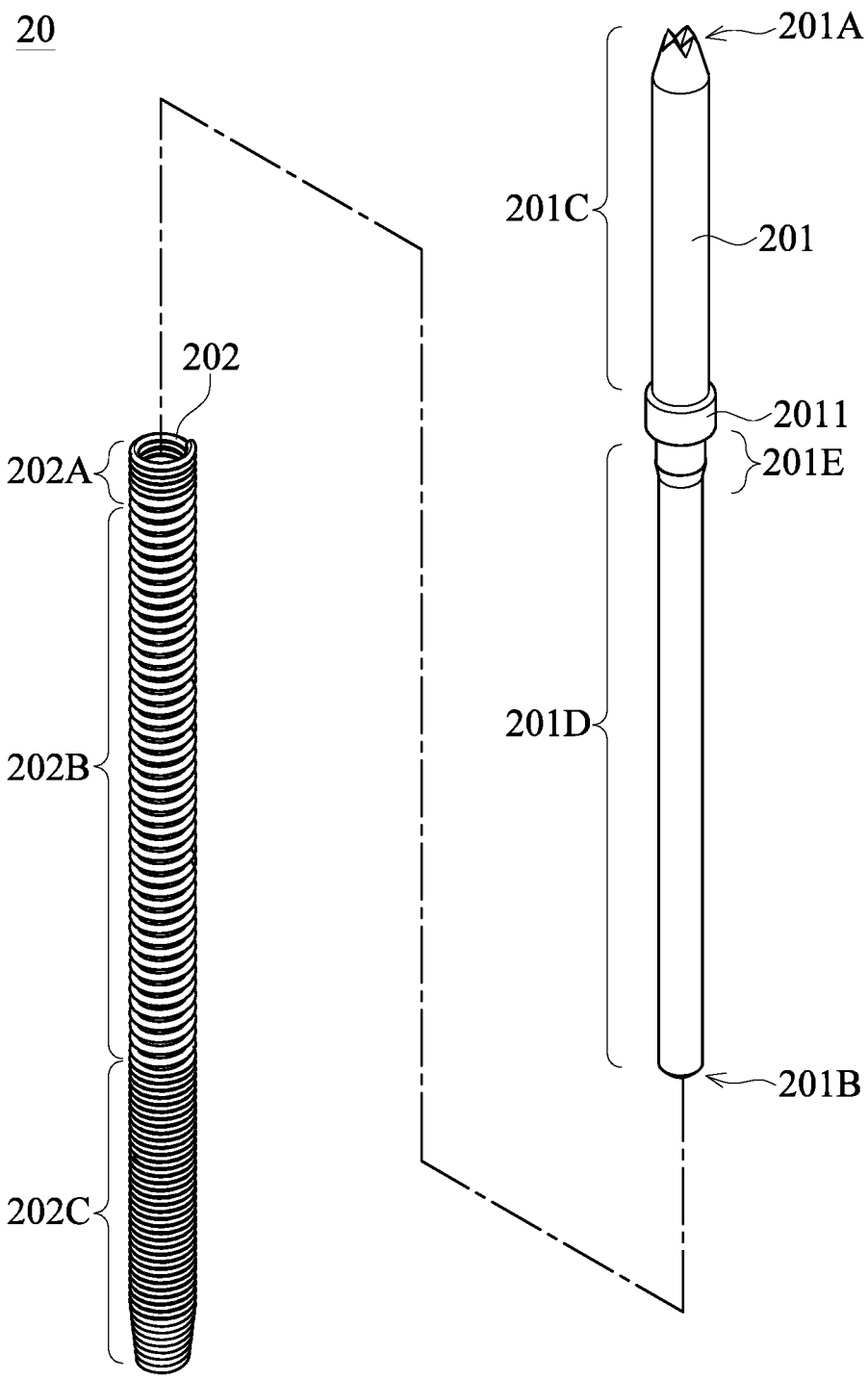
FIG. 10 is an exploded view of a probe assembly of the electrically connecting unit according to the present disclosure.

FIG. 10 is an exploded view of one of probe assemblies 20. As shown in FIG. 10, the probe assembly 20 includes a pin 201 and a spring 202. The pin 201 is a rod structure, and has a contacting end 201A and a tail end 201B both arranged on two opposite ends thereof. The pin 201 has a protrusion 2011 arranged adjacent to the contacting end 201A, and the protrusion 2011 in the present embodiment is an annular structure, but the present disclosure is not limited thereto. The pin 201 can be defined as an exposed segment 201C and a received segment 201D by the protrusion 2011. The received segment 201D of the pin 201 is inserted into the spring 202, and the exposed segment 201C is arranged outside of the spring 202.

The received segment 201D of the pin 201 has a fixing segment 201E arranged adjacent to the protrusion 2011. A diameter of the fixing segment 201E is larger than that of the other portions of the received segment 201D.

The spring 202 sequentially includes a first close segment 202A, an elastic segment 202B, and a second close segment 202C. An inner diameter of the first close segment 202A is less than the diameter of the fixing segment 201E. When the received segment 201D of the pin 201 is inserted into the spring 202, the fixing segment 201E and the first close segment 202A are engaged with each other, a distal end of the spring 202 arranged adjacent to the first close segment 202A is abutted against a side of the protrusion 2011. In other words, the inner diameter of the first close segment 202A of the spring 202 and the diameter of the fixing segment 201E of the pin 201 are designed to be cooperated with each other, so that an end portion of the spring 202 can be fixed onto the fixing segment 201E of the pin 201.

Each of the first close segment 202A and the second close segment 202C has a pitch less than a pitch of the elastic segment 202B. Moreover, the pitch of the first close segment 202A or the second close segment 202C can be approached to zero, so that if the spring 202 is pressed, the first close segment 202A and the second close segment 202C are not deformed. Accordingly, the first close segment 202A and the second close segment 202C of the spring 202 are formed to fix to the pin 201 and the seat structure 231.

A length of the first close segment 202A of the spring 202 is less than that of the elastic segment 202B, and a length of the second close segment 202C is determined according to the depth of each of the thru-holes 231A of the seat structure 231.

The spring 202 of each of the probe assemblies 20 in the present embodiment is an electrically conductive material. When the spring 202 is sleeved around the pin 201 and the first close segment 202A is fixed to the fixing segment 201E, the tail end 201B of the pin 201 can be received in the spring 201, so that a distal end of the second close segment 202C of the spring 202 can be structurally and electrically connected to the circuit board 1. Accordingly, the current and signal transmission between the circuit board 1 and the chip C can be achieved by the pin 201 and the spring 202.

As shown in FIG. 6 and FIG. 10, the auxiliary structure 232 includes a plurality of abutting portions 2321 respectively arranged in the supporting holes 232A. The abutting portions 2321 are configured to respectively abut against the protrusions 2011 of the pins 201. When the probe assembly 20 is arranged in the probe channel T, the protrusion 2011 of the pin 201 is abutted against the abutting portion 2321, and the abutting portion 2321 is formed to prevent the pin 201 from moving toward the lift structure 22 relative to the auxiliary structure 232. Since the protrusion 2011 of the pin 201 is abutted against the abutting portion 2321, the received segment 201D of the pin 201 is arranged in the seat structure 231 and the auxiliary structure 232 (or is arranged in the supporting structure 23), most of the exposed segment 201C of the pin 201 is arranged outside of the supporting structure 23, and a portion of the pin 201 close to the contacting end 201A is arranged in the connecting hole 22A.

As shown in FIG. 3 and FIG. 6, each of the electrically connecting units 2 can be fixed onto the circuit board 1 in a screwing manner, and (the first end of) each of the probe assemblies 20 can be abutted against the circuit board 1; that is to say, the connection between the probe assemblies 20 and the circuit board 1 can be achieved without using a soldering manner. Accordingly, any of the electrically connecting units 2 or any of the probe assemblies 20 can be replaced according to practical requirements.

As shown in FIG. 8 and FIG. 9, when the pressing device E2 is separated from the retaining portions 223, the return force generated from each of the elastic assemblies 24 will move the lift structure 22 from a position adjacent to the auxiliary structure 232 toward the top wall 211 so as to abut against the inner surface 2112. When the lift structure 22 is moved from a position shown in FIG. 10 to a position shown in FIG. 8, the movement of the lift structure 22 causes the chip C to be separated from the contacting ends 201A of the pins 201, so that the chip C is not electrically connected to the probe assemblies 20. In other words, the chip C is not connected to the probe assemblies 20.

As shown in FIG. 6 and FIG. 10, under the limitation about the length H1 less than the distance D1 is satisfied, when the pressing device E2 is abutted against the outer surface 2111, the lift structure 22 and the auxiliary structure 23 will have a gap G there-between. According, if the lift structure 22 or the auxiliary structure 232 has a production error, the pressing device E2 can be ensured to abut against the outer surface 2111 by the gap G.

In other embodiments of the present disclosure, when the pressing device E2 presses the lift structure 22 and the probe assemblies 20 are connected to the contacts C2 of the chip C, the pressing device E2 cannot press the outer surface 2111, but the lift structure 22 is abutted against the supporting structure 23. In other words, when the chip C is arranged in the chip receiving slot 22B of the electrically connecting unit 2 and the lift structure 22 is not pressed, the probe assemblies 20 are not connected to the chip C. When the lift structure 22 is pressed to move into the main body 21, the probe assemblies 20 are abutted against the chip C for establishing an electrical connection there-between. When the lift structure 22 is no longer pressed, the lift structure 22 returns to an original state, and the chip C is not connected to the probe assemblies 20.

Figure 11:
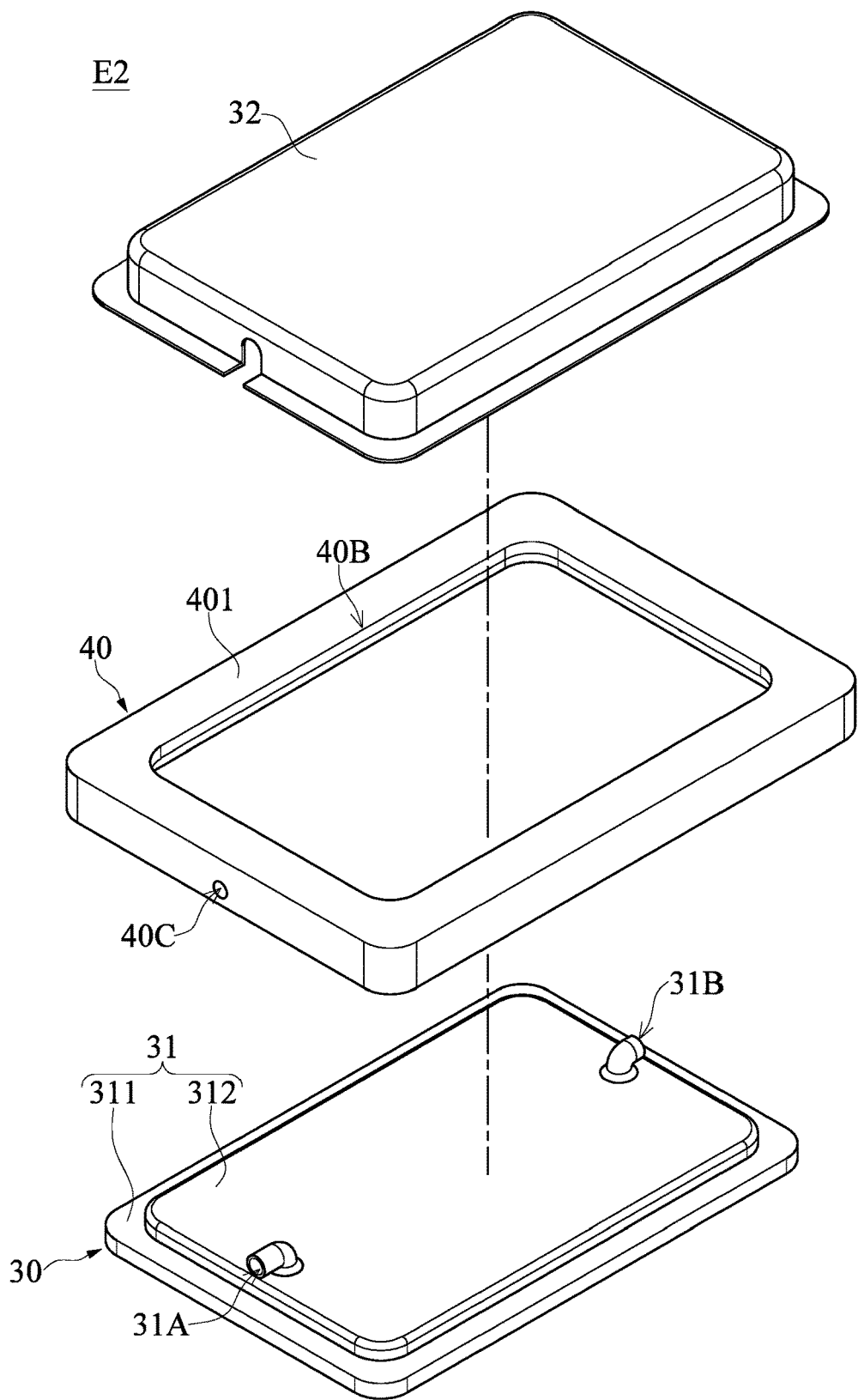
FIG. 11 is an exploded view showing the pressing device according to the present disclosure.
Figure 12:
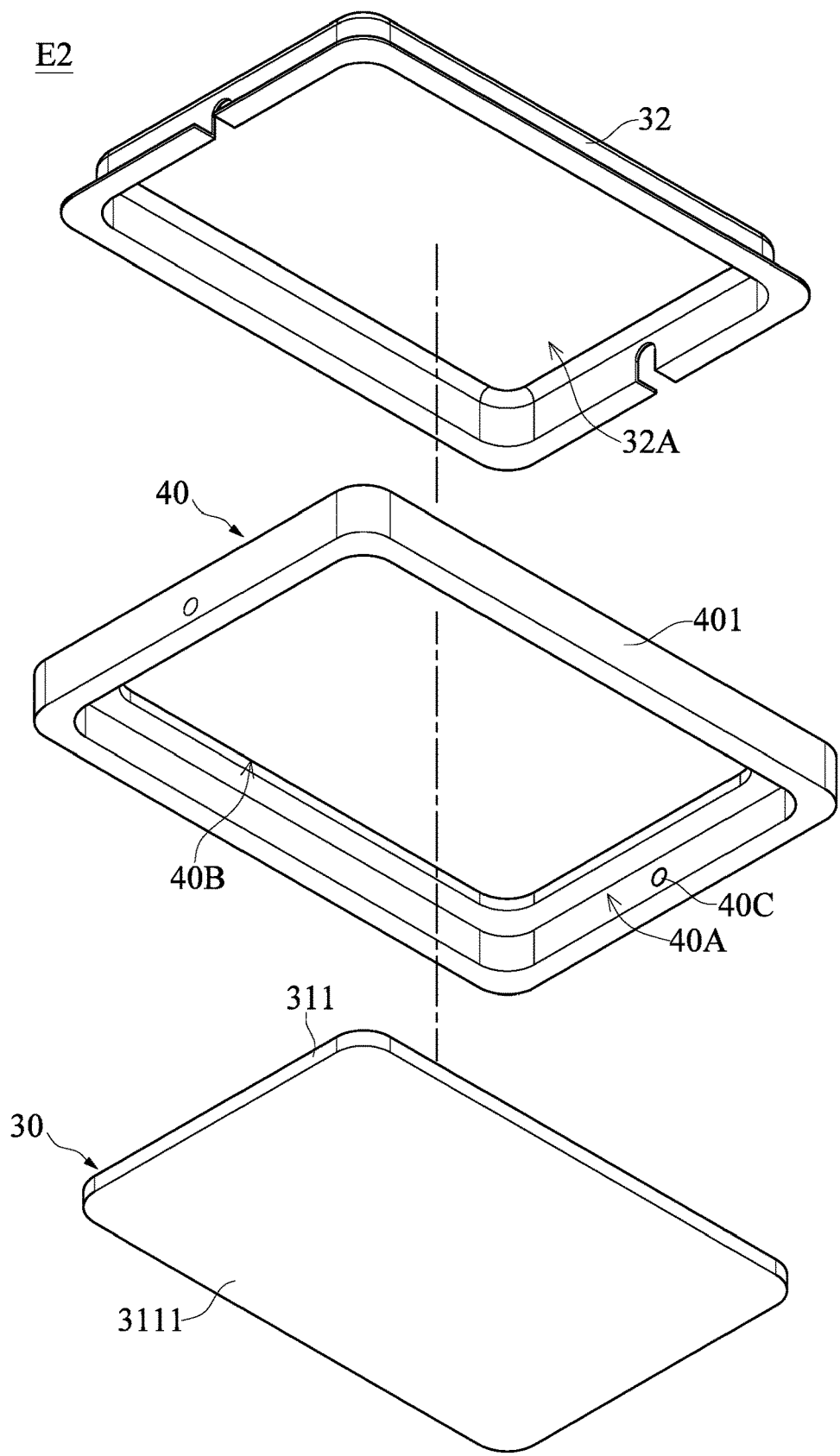
FIG. 12 is an exploded view showing the pressing device from another angle of view according to the present disclosure.
Figure 13:
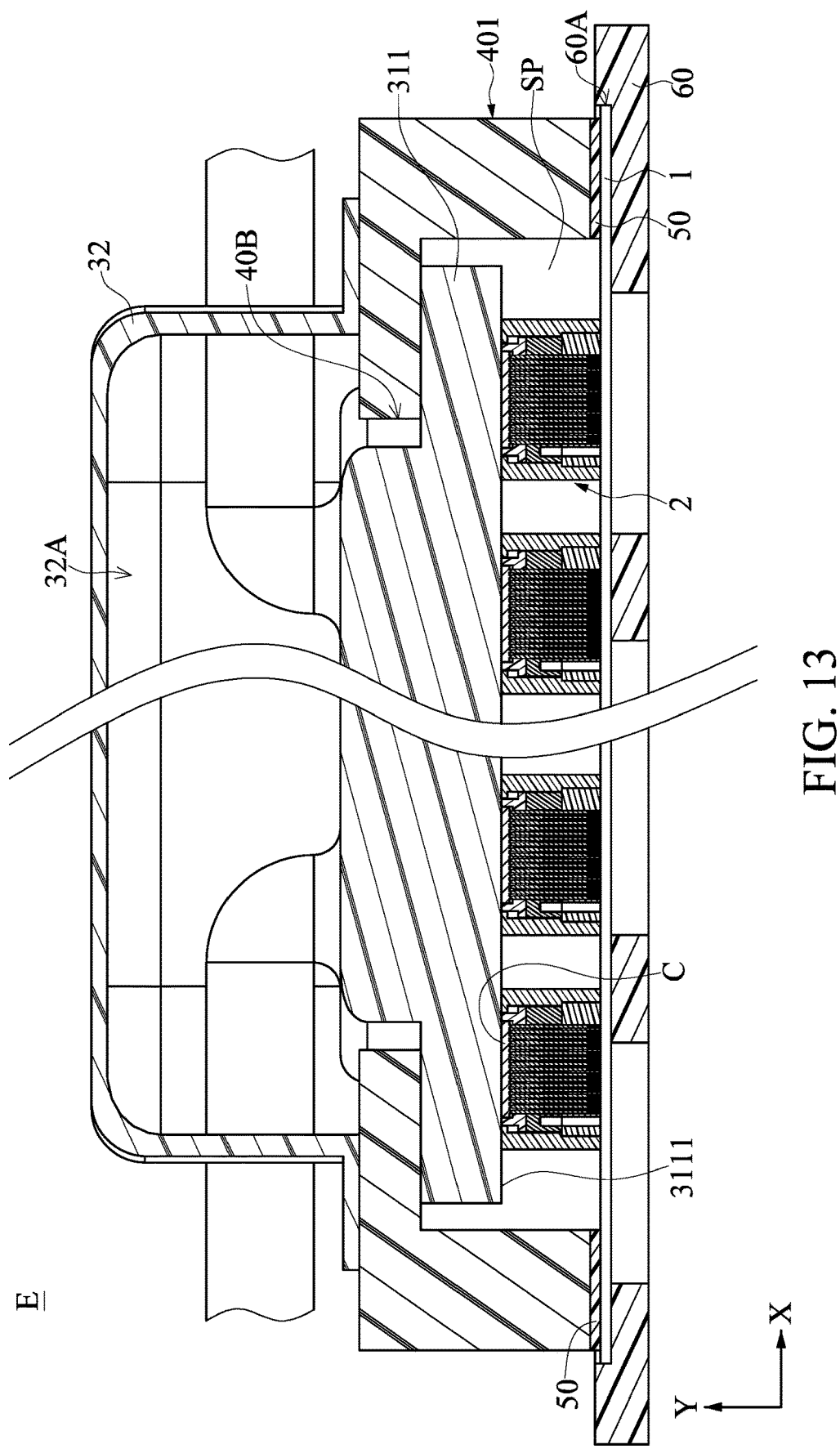
FIG. 13 is a cross-sectional view taken along line XIII-XIII of FIG. 1.

FIG. 11 and FIG. 12 are exploded views showing the pressing device E2 of the testing apparatus E according to one of the embodiments of the present disclosure. FIG. 13 is a cross-sectional view showing the pressing device E2 abutted against the electrically connecting units 2. As shown in FIG. 11 to FIG. 13, the pressing device E2 can include a temperature adjusting assembly 30 and an exhaust assembly 40. The number of the temperature adjusting assembly 30 can be changed according to design requirements, and is not limited to one.

The temperature adjusting assembly 30 can include a temperature conditioner 31 and a lid 32. The temperature conditioner 31 includes a flat structure 311 arranged on one side thereof, and the flat structure 311 has a flat contacting surface 3111. The temperature conditioner 31 can have heating coils (not shown) arranged inside thereof for being heated to generate heat energy. The temperature conditioner 31 has at least one fluid channel (not shown) arranged inside thereof, a fluid entrance 31A, and a fluid exit 31B. The fluid entrance 31A and the fluid exit 31B are in spatial communication with the fluid channel. Specifically, a fluid having low temperature can flow into the fluid channel through the fluid entrance 31A, and then can flow out of the fluid channel from the fluid exit 31B. In addition, a flat portion of the pressing device E2 shown in FIG. 9 can be regarded as the flat structure 311 of the temperature adjusting assembly 30. The number of the fluid entrance 31A or the number of the fluid exit 31B can be added according to design requirements, and is not limited to one. Moreover, the number of the temperature conditioner 31 is also not limited to one. In other embodiments of the present disclosure, the number of the temperature conditioner 31 can be at least two.

As shown in FIG. 12 and FIG. 9, when the pressing device E2 presses the electrically connecting units 2, the flat structure 311 of the pressing device E2 is abutted against the outer surface 2111 of each of the electrically connecting units 2 and the outer surface C2 of each of the chips C. At the same time, the temperature conditioner 31 can be controlled by a controlling unit or a controlling apparatus to heat the heating coils thereof so as to increase the temperature of the flat structure 311. Accordingly, the chip C can be tested under a high temperature. Moreover, a fluid storage apparatus (not shown) connected to the temperature conditioner 31 can be controlled by the controlling unit or the controlling apparatus to output a fluid having low temperature into the temperature conditioner 31 through the fluid entrance 31A so as to decrease the temperature of the flat structure 311. Accordingly, the chip C can be tested under a low temperature.

In addition, the pressing device E2 can include the heating coils, but exclude the fluid channel. Or, the pressing device E2 can include the fluid channel, but exclude the heating coils. Accordingly, the pressing device E2 is not limited to have a heating function and a cooling function. In other words, the pressing device E2 can be provided with at least one of the heating function and the cooling function. In other embodiments of the present disclosure, if the pressing device E2 only includes the fluid channel (i.e., excludes the heating coils), the fluid channel can be used to receive a fluid having a high temperature, so that the pressing device E2 still has the heating function.

The temperature adjusting assembly 30 disclosed in the above description is only one of the embodiments, but the present disclosure is not limited thereto. For example, the temperature adjusting assembly 30 can include a cooling chip.

The lid 32 is disposed and fixed on a side of the temperature conditioner 31, and is configured to block transmission of heat energy. Accordingly, the rapid dissipation of the heat energy generated from the temperature conditioner 31 can be avoided, or transmission of heat energy from an external side into the temperature conditioner 31 that provides the fluid having low temperature to flow there-through can be avoided. In practical use, the lid 32 and the temperature conditioner 31 can jointly form an accommodating space 32A therein that can be filled with any member for blocking transmission of heat energy. The shape and size of the temperature conditioner 31 or the lid 32 shown in the drawings is one of the embodiments, and can be changed according to design requirements. In addition, the temperature conditioner 31 is not limited to heat the heating coils to generate heat energy, and is not limited to use a fluid having low temperature to decrease temperature.

The exhaust assembly 40 includes a cover 401 having a concavity 40A formed on one side thereof. The cover 401 has an accommodating opening 40B in spatial communication with the concavity 40A. The temperature conditioner 31 includes a protruding portion 312 extending from a side of the flat structure 311 opposite to the flat contacting surface 3111. The flat structure 311 is arranged and fixed in the concavity 40A, and the protruding portion 312 passes through the accommodating opening 40B. The fluid entrance 31A and the fluid exit 31B are formed on the protruding portion 312, but can be changed according to design requirements. The lid 32 is arranged at one side of the cover 401 that is opposite to the concavity 40A. The cover 401 further has two exhaust holes 40C for being connected to an air suction apparatus. The size and shape of the cover 401 or the number and size of the exhaust holes 40C can be adjusted or changed according to design requirements.

As shown in FIG. 13 and FIG. 9, when the pressing device E2 is located at one side of the circuit board 1, the flat structure 311 of the temperature conditioner 31 is abutted against the retaining portions 223 of the electrically connecting units 2. In the meantime, the cover 401, the circuit board 1, and the flat structure 311 jointly form an accommodating space SP that is in spatial communication with the two exhaust holes 40C, so that the air suction apparatus can perform a suction operation to expel air in the accommodating space SP so as to cause the accommodating space SP to be under a negative pressure, causing the flat structure 311 to easily abut against the retaining portions 223 of the electrically connecting units 2 mounted on the circuit board 1.

Specifically, when the pressing device E2 presses the retaining portions 223, the pressing device E2 needs to resist the return forces generated from the elastic assemblies 24 and the probe assemblies 20. Accordingly, when the number of the electrically connecting units 2 mounted on the circuit board 1 is increased, a pressing force of the pressing device E2 simultaneously applied to the retaining portions 223 of the electrically connecting units 2 needs to be increased. In the above condition, the pressing device E2 can be cooperated with the air suction apparatus to cause the accommodating space SP to be under the negative pressure, thereby effectively reducing the pressing force of the pressing device E2 simultaneously applied to the retaining portions 223.

Since the pressing device E2 is cooperated with the air suction apparatus to cause the accommodating space SP to be under the negative pressure, the accommodating space SP can be in a substantial vacuum mode. Accordingly, when the temperature conditioner 31 is operated to increase or decrease the temperature of the chips C, the temperature of the accommodating space SP can effectively avoid being affected by an external environment.

As shown in FIG. 2 and FIG. 13, the exhaust assembly 40 can include an airtight member 50 and a structural reinforcement member 60. The airtight member 50 can be an annular structure, and is sandwiched between the cover 401 and the circuit board 1 so as to prevent the accommodating space SP from being in air communication with an external space. In practical use, the airtight member 50 can be engaged with the cover 401 or the circuit board 1, but the present disclosure is not limited thereto. Moreover, the shape, size, or position of the airtight member 50 can be adjusted or changed according to design requirements. It should be noted that any airtight components can be added to be disposed at positions that may affect the air tightness of the accommodating space SP. For example, as shown in FIG. 3, each of the screwing holes 21C can be provided with a resilient gasket arranged therein or an adhesive filled therein, thereby improving the air tightness between the screwing holes 21C and the screwing members.

The structural reinforcement member 60 has an engaging slot 60A recessed in a side thereof, and the circuit board 1 is engaged with the engaging slot 60A. The structural reinforcement member 60 is configured to reinforce the structural strength of the circuit board 1, thereby preventing the circuit board 1 from being deformed in an air suction process of the accommodating space SP. Moreover, excepting the engaging connection between the structural reinforcement member 60 and the circuit board 1, the circuit board 1 and the structural reinforcement member 60 can be further fixed to each other by using screwing members (e.g., screws), and can be provided with a sealing gasket, a soldering connection, or a sealing adhesive there-between, thereby sealing gaps between the circuit board 1 and the screwing members.

In other embodiments of the present disclosure, the number or position of the structural reinforcement member 60 can be adjusted according to design requirements. For example, the number of the structural reinforcement member 60 of the testing apparatus E can be two, and the circuit board 1 is sandwiched between the two structural reinforcement members 60.

Figure 14:
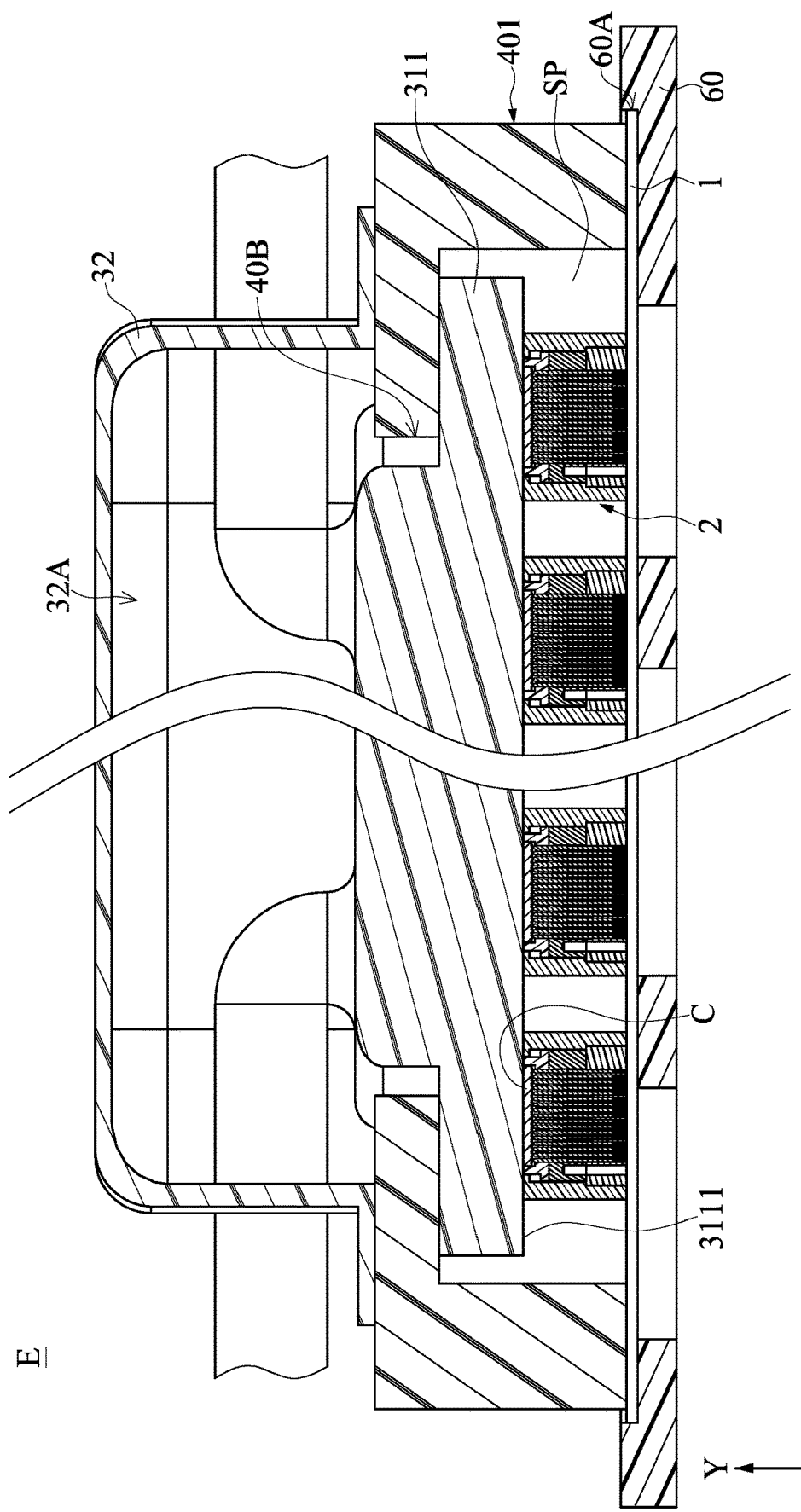
FIG. 14 is a cross-sectional view of the testing apparatus in another configuration.

FIG. 14 is a cross-sectional view of the testing apparatus in another configuration. The difference between the testing apparatus E shown in FIG. 14 and shown in FIG. 13 is described as follows. As shown in FIG. 14, the testing apparatus E can be provided without the airtight member 50, and the cover 401 can be direct abutted against the circuit board 1. In addition, the cover 401 and the circuit board 1 can be formed with engaging structures for engaging with each other.

Figure 15:
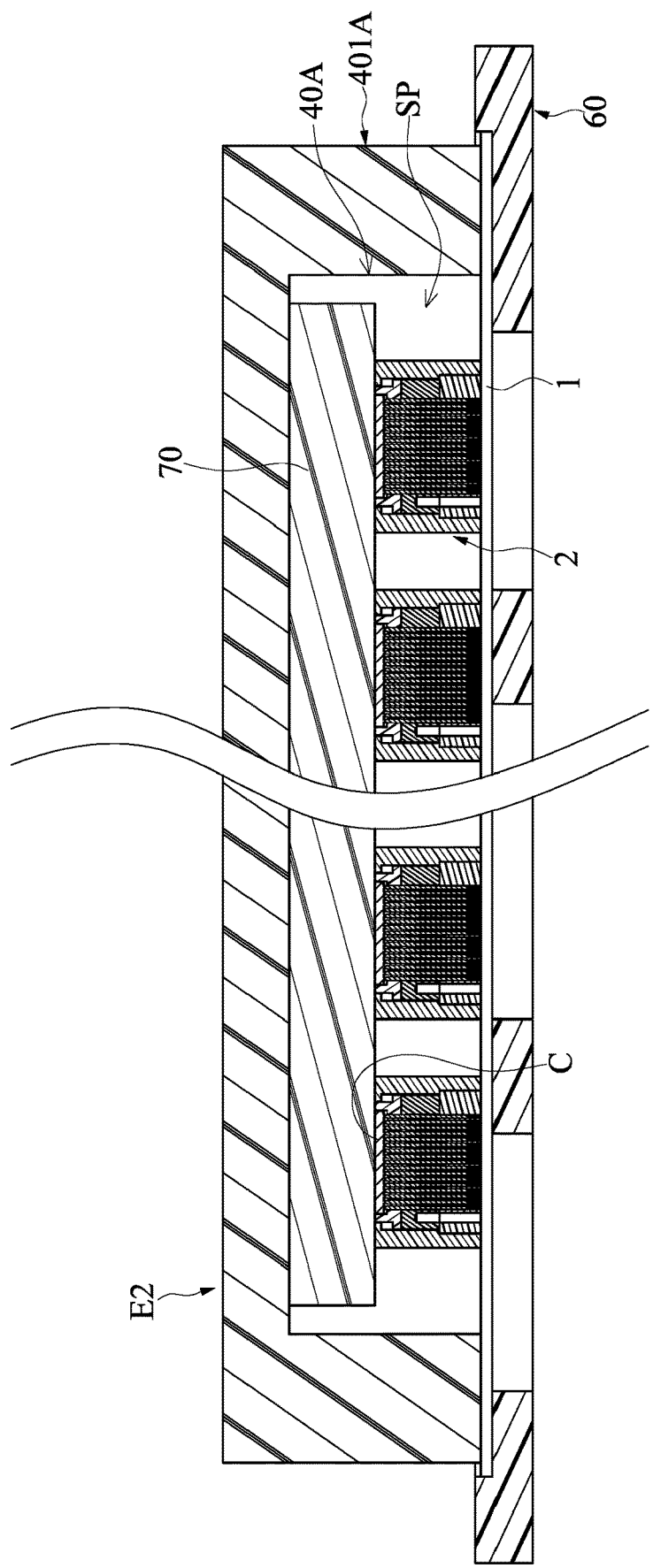
FIG. 15 is a cross-sectional view showing the pressing device in another configuration and the chip carrying device.

FIG. 15 is a cross-sectional view showing the testing apparatus E in another configuration and the chip carrying device E1. The difference between the testing apparatus E shown in FIG. 15 and shown in FIG. 14 is described as follows. As shown in FIG. 15, the pressing device E2 can include the exhaust assembly 40, but excludes the temperature adjusting assembly 30. The exhaust assembly 40 has a cover 401A. The cover 401A has a concavity 40A recessed in one side thereof, but does not have the accommodating opening 40B. In addition, the pressing device E2 further includes an abutting member 70.

The cover 401A is disposed on the circuit board 1 so as to jointly define an accommodating space SP. The cover 401A has at least one exhaust hole 40C (shown in FIG. 12) for providing an air suction apparatus to perform a suction operation to expel air in the accommodating space SP. The abutting member 70 can be detachably fixed to the cover 401A, and is arranged in the concavity 40A. Moreover, in other embodiments of the present disclosure, the abutting member 70 can be fixed to the cover 401A by an undetachable manner (e.g., an adhering manner).

Figure 16:
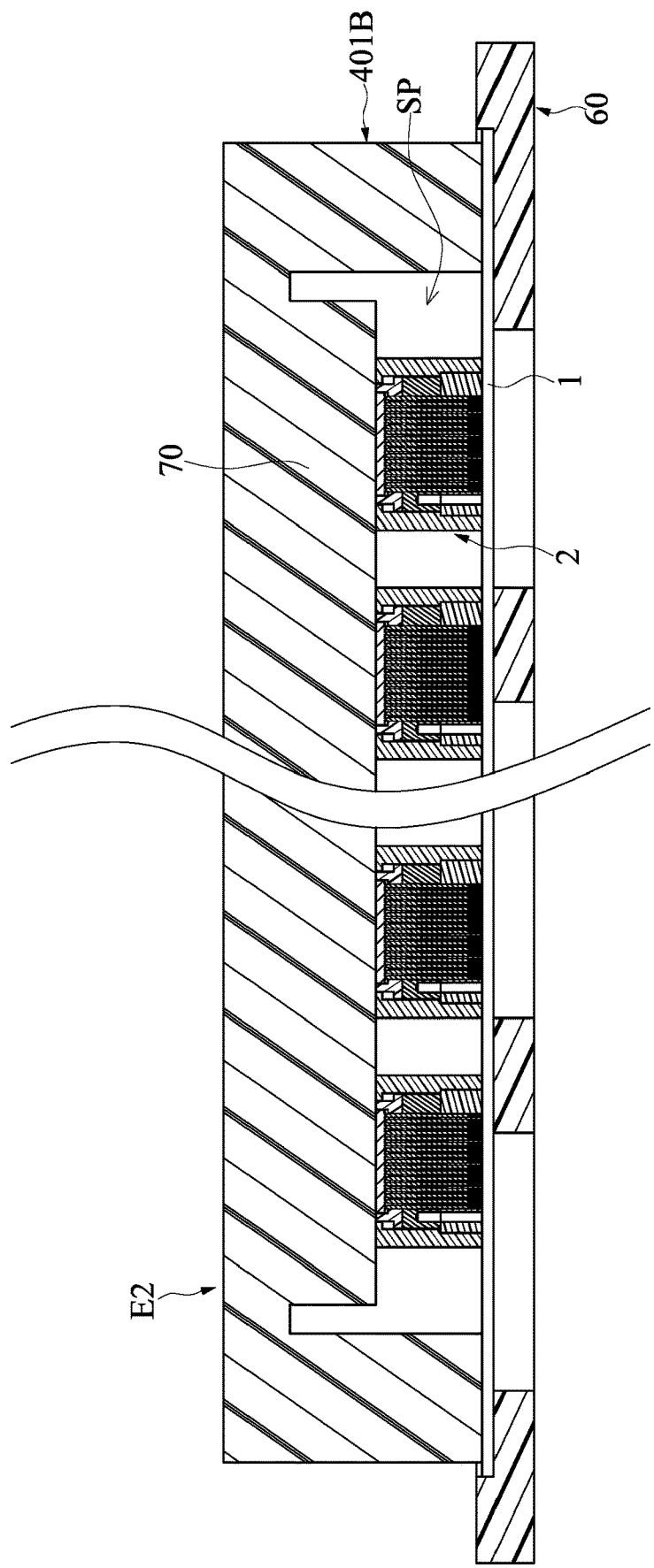
FIG. 16 is a cross-sectional view showing the pressing device in still another configuration and the chip carrying device.

The cover 401A can be fixed on the circuit board 1 by a plurality of screwing members (e.g., screws). When the cover 401A is disposed on the circuit board 1, the abutting member 70 is disposed between the cover 401A and the electrically connecting units 2, and the abutting member 70 is abutted against the chips C disposed on the electrically connecting units 2 (shown in FIG. 9). When the cover 401A is fixed onto the circuit board 1 and the air suction apparatus performs a suction operation to expel the air in the accommodating space SP to cause the accommodating space SP to be under a predetermined pressure (e.g., a negative pressure), the abutting member 70 simultaneously presses the retaining portions 223 of the electrically connecting units 2 so as to move the retaining portions 223 into the main body 21, and the abutting member 70 is abutted against outer surfaces C2 of the chips arranged away from the electrically connecting units 2 for establishing an electrical connection between the probe assemblies 20 of each of the electrically connecting units 2 and the corresponding chip C. As shown in FIG. 16, the cover 401B can be integrally formed with the abutting member 70, and the cover 401B and the abutting member 70 are not respectively limited to two independent components.

In conclusion, the testing apparatus of the present disclosure can use the pressing device to simultaneously press the chips fastened to the electrically connecting units, so that the chips can be tested under a same temperature. Moreover, when the chip is tested by the testing apparatus of the present disclosure, the electrically connecting unit can be used to firmly connect the chip and the probe assemblies by the cooperation of the lift structure, the elastic assembly, and the probe assemblies.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A testing apparatus for testing a plurality of chips, comprising:
    a chip carrying device including:
        at least one circuit board; and
        a plurality of electrically connecting units disposed on the at least one circuit board for carrying the chips; and
    a pressing device including:
        a cover having a concavity formed on one side thereof, wherein the cover is disposed on the at least one circuit board so as to jointly define an accommodating space, and the electrically connecting units are arranged in the accommodating space, and wherein the cover is configured to be connected to an air suction apparatus for expelling the air in the accommodating space so as to cause the accommodating space to be under a negative pressure; and
        an abutting member disposed between the cover and the electrically connecting units and at least partially arranged in the accommodating space;
    wherein when the air suction apparatus performs a suction operation to expel the air in the accommodating space so as to cause the accommodating space to be under a predetermined pressure, the abutting member is abutted against the electrically connecting units and the chips so as to connect each of the electrically connecting units and the corresponding chip.

2. The testing apparatus according to claim 1, wherein the cover or the at least one circuit board has at least one exhaust hole for providing the air suction apparatus to perform a suction operation to expel the air in the accommodating space.

3. The testing apparatus according to claim 1, wherein each of the electrically connecting units includes:
    a main body having a top wall and an annular wall, wherein the top wall has an opening, one end of the annular wall is connected to a peripheral edge of the top wall, and the other end of the annular wall is disposed on the at least one circuit board, wherein the top wall, the annular wall, and the at least one circuit board jointly define an accommodating slot, and wherein the top wall has an inner surface arranged in the accommodating slot and an outer surface opposite to the inner surface;
    a supporting structure disposed on the at least one circuit board and arranged in the accommodating slot;
    a lift structure arranged in the accommodating slot and including a base portion, a carrying portion extending from the base portion, and a plurality of retaining portions extending from the carrying portion along a direction away from the base portion, wherein the base portion is arranged in the accommodating slot, and the carrying portion is at least partially arranged in the opening, wherein at least part of the retaining portions protrude from the opening of the main body, and the retaining portions and the carrying portion jointly form a chip receiving slot for accommodating one of the chips having a plurality of contacts, and wherein the lift structure has a plurality of connecting holes penetratingly formed through the base portion and the carrying portion;
    at least one elastic assembly arranged in the accommodating slot, wherein one end of the at least one elastic assembly is fixed to the lift structure, and the other end of the at least one elastic assembly is fixed to the supporting structure, and wherein the at least one elastic assembly is configured to be pressed to generate a return force that pushes the base portion to abut against the inner surface of the top wall, so that the lift structure and the supporting structure have a gap therebetween; and
    a plurality of probe assemblies connected to the at least one circuit board and each having a first end and an opposite second end, wherein the first ends of the probe assemblies are fixed to the supporting structure, and the second ends of the probe assemblies are respectively arranged in the connecting holes,
    wherein in each of the electrically connecting units, when the chip receiving slot receives the corresponding chip and the retaining portions are not pressed by the abutting member, the probe assemblies in the connecting holes are not connected to the contacts of the corresponding chip, and
    wherein in each of the electrically connecting units, when the chip receiving slot receives the corresponding chip and the abutting member is abutted against the outer surface of the top wall, the retaining portions protruding from the opening of the main body are pressed by the pressing device so as to move toward the accommodating slot, the probe assemblies are respectively abutted against the contacts of the corresponding chip for establishing an electrical connection between the probe assemblies and the corresponding chip.

4. The testing apparatus according to claim 3, wherein in each of the electrically connecting units, a longitudinal direction of each of the probe assemblies defines an axis direction, and when the retaining portions are not pressed by the abutting member, a portion of each of the retaining portions protruding from the opening has a length in the axis direction, and the length is less than or equal to a distance between the lift structure and the supporting structure in the axis direction.

5. The testing apparatus according to claim 4, wherein in each of the electrically connecting units, when the chip receiving slot receives the corresponding chip and the abutting member is abutted against the outer surface of the top wall, the second ends of the probe assemblies protrude from the connecting holes.

6. The testing apparatus according to claim 3, wherein in each of the electrically connecting units, a longitudinal direction of each of the probe assemblies defines an axis direction, and when the lift structure is not pressed by the abutting member, a distance between the second end of each of the probe assemblies and an adjacent edge of the corresponding connecting hole is less than or equal to a distance between the lift structure and the supporting structure in the axis direction.

7. The testing apparatus according to claim 6, wherein in each of the electrically connecting units, when the chip receiving slot receives the corresponding chip, the abutting member is configured to simultaneously press the outer surface of the top wall and an outer surface of the corresponding chip arranged away from the lift structure.

8. The testing apparatus according to claim 7, wherein in each of the electrically connecting units, when the chip receiving slot receives the corresponding chip and the abutting member is abutted against the outer surface of the top wall, the second ends of the probe assemblies protrude from the connecting holes.

9. The testing apparatus according to claim 3, wherein in each of the electrically connecting units, when the chip receiving slot receives the corresponding chip and the abutting member presses the retaining portions to cause the lift structure to abut against the supporting structure, the probe assemblies are respectively abutted against the contacts of the corresponding chip, and the abutting member is abutted against an outer surface of the corresponding chip arranged away from the lift structure.

* * * * *